United States Patent
Chen et al.

(10) Patent No.: US 10,886,471 B2
(45) Date of Patent: Jan. 5, 2021

(54) POLYMERIC ELECTRODE MODIFIERS

(71) Applicant: Flexterra, Inc., Skokie, IL (US)

(72) Inventors: Zhihua Chen, Skokie, IL (US);
Darwin Scott Bull, Billerica, MA (US);
Mark Seger, Chicago, IL (US);
Timothy Chiu, Chicago, IL (US); Yu Xia, Northbrook, IL (US); Antonio Facchetti, Chicago, IL (US)

(73) Assignee: Flexterra, Inc., Skokie, IL (US)

( * ) Notice: Subject to any disclaimer, the term of this patent is extended or adjusted under 35 U.S.C. 154(b) by 0 days.

(21) Appl. No.: 16/620,094

(22) PCT Filed: Jun. 6, 2018

(86) PCT No.: PCT/US2018/036311
§ 371 (c)(1),
(2) Date: Dec. 6, 2019

(87) PCT Pub. No.: WO2018/226865
PCT Pub. Date: Dec. 13, 2018

(65) Prior Publication Data
US 2020/0203613 A1 Jun. 25, 2020

Related U.S. Application Data

(60) Provisional application No. 62/516,630, filed on Jun. 7, 2017.

(30) Foreign Application Priority Data

Jul. 6, 2017 (IT) .......................... 102017000076313

(51) Int. Cl.
*H01L 51/00* (2006.01)
*H01L 51/05* (2006.01)
*H01L 51/10* (2006.01)

(52) U.S. Cl.
CPC ...... *H01L 51/0034* (2013.01); *H01L 51/0541* (2013.01); *H01L 51/0021* (2013.01); *H01L 51/105* (2013.01)

(58) Field of Classification Search
CPC .................................................. H01L 51/0034
USPC ........................................................ 528/378
See application file for complete search history.

(56) References Cited

U.S. PATENT DOCUMENTS

2004/0161873 A1  8/2004  Dimitrakopoulos et al.

FOREIGN PATENT DOCUMENTS

GB      2 536 426      9/2016

OTHER PUBLICATIONS

Boudinet et al., "Modification of gold source and drain electrodes by self-assembled monolayer in staggered n- and p-channel organic thin film transistors", Organic Electronics, Elsevier, Amsterdam, NL, vol. 11, No. 2, Oct. 30, 2009, pp. 227-237.
International Search Report and Written Opinion of International Application No. PCT/US2018/036311 dated Sep. 7, 2018, 12 pages.

*Primary Examiner* — Duc Truong
(74) *Attorney, Agent, or Firm* — McDonnell Boehnen Hulbert & Berghoff LLP

(57) ABSTRACT

The present teachings relate to novel polymeric materials for electrode treatment. The present polymeric electrode modifiers can be derived from an episulfide monomer via either an acid-catalyzed ring-opening polymerization reaction or a nucleophilic polymerization reaction.

18 Claims, 5 Drawing Sheets

POLYMERIC ELECTRODE MODIFIERS

CROSS-REFERENCE TO RELATED APPLICATIONS

This application is a U.S. national phase application of International Patent Application no. PCT/US2018/036311, filed Jun. 6, 2018. International Patent Application no. PCT/US2018/036311 claims the benefit of priority of U.S. Provisional Patent Application No. 62/516,630, filed Jun. 7, 2017, and Italian Patent Application no. 102017000076313, filed Jul. 6, 2017, each of which is hereby incorporated herein by reference in its entirety.

FIELD

This application relates to optical, electronic, and optoelectronic device having surface-modified electrodes.

BACKGROUND

Self-assembled monolayers (SAM) are thin surface coatings that are formed by the interaction of a molecule with a surface followed by organization of the adsorbed molecules into defined structures. A typical example of a SAM is the adsorption of alkylthiols onto a gold surface. In this case, the thiol "head group" initially physisorbs to the gold surface and is eventually converted to a chemisorbed Au-thiolate. The alkyl "tails" also interact with each other via van der Waals interactions to form ordered structures. SAMs have been extensively studied from a theoretical and practical perspective and have found utility in the fields of corrosion prevention, adhesives, and lubrication.

Thiolate-based SAMs also have found use in organic electronic devices to achieve higher charge carrier mobility and increased on-current. The actual mechanism is thought to be related to either the reduction of the Schottky energy barrier between metal electrodes and organic semiconductors, and/or the modification of the crystal morphology of the organic semiconductor. In organic thin film transistor (OTFT) applications, different thiols have been shown to either increase the work function of metal electrodes to match the highest occupied molecular orbital (HOMO) energy of p-type semiconductors, or to lower the work function of metal electrodes to match the lowest unoccupied molecular orbital (LUMO) enemy of n-type semiconductors. By matching the work function of the metal electrodes to the orbital energy of the semiconductor, charge carrier injection increases which in turn improves device performance.

While the existing SAM technology confers important performance benefits to organic electronic devices, it also imposes limitations in terms of stability. SAMs are intrinsically mobile structures that exist in thermodynamic equilibrium, Rearrangement, competitive displacement, thermal desorption, and electrochemical desorption have all been observed. As such, the interface between the SAM-treated electrode and the organic semiconductor is also under the influence of these thermodynamic variables.

Accordingly, there is a need in the art to develop electrode treatments that yield the performance benefits of the current self-assembled monolayer technology while maintaining stable device performance. In addition, it would be advantageous to provide an electrode treatment that does not have the objectionable odor of typical thiols.

SUMMARY

In light of the foregoing, the present teachings relate to polymeric electrode modifiers that can be used to improve the performance of organic electronic devices. Unlike current thiolate-based SAM treatment, the present polymeric electrode modifiers can provide more stabilized surfaces, which in turn leads to more stable device performance.

Generally, the present polymeric electrode modifiers are derived from an episulfide monomer (also known as a thiirane) of the formula:

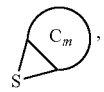

wherein the moiety

is a carbocyclic group having 5-20 carbon atoms. Upon an acid-catalyzed ring-opening polymerization reaction, the episulfide monomer polymerizes into a polymer having a repeating unit of the formula:

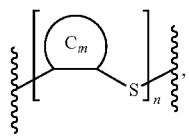

where n can be an integer ranging from 3 to 1,000 (inclusive).

In one aspect, the present teachings provide a method for modifying one or more metal or metal alloy electrodes in an optical, electronic, or optoelectronic device. The method includes contacting the one or more electrodes with a composition including a polymeric electrode modifier according to the present teachings, forming a surface-modifying layer in contact with the surfaces of the one or more electrodes. Without wishing to be bound by any particular theory, it is believed that the sulfur atoms of the present polymer can adsorb to metal surfaces in a self-assembled manner similar to standard thiols and sulfides, which helps limit the thickness of the polymeric surface-modifying layer, thereby preventing the polymer film from becoming an electrically insulating layer.

In another aspect, the present teachings relate to optical, electronic, or optoelectronic device that include one or more electrodes composed of a metal or metal alloy, wherein the surface of at least one of the one or more electrodes is in contact with a surface-modifying layer that includes the present polymer. The device, for example, can be an organic thin film transistor that includes a substrate, an organic semiconductor layer, source and drain electrodes in contact with the organic semiconductor layer, a gate dielectric layer, and a gate electrode in contact with the gate dielectric layer, where the surfaces of the source and drain electrodes are in contact with the surface-modifying layer.

The foregoing as well as other features and advantages of the present teachings will be more fully understood from the following figures, description, examples, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
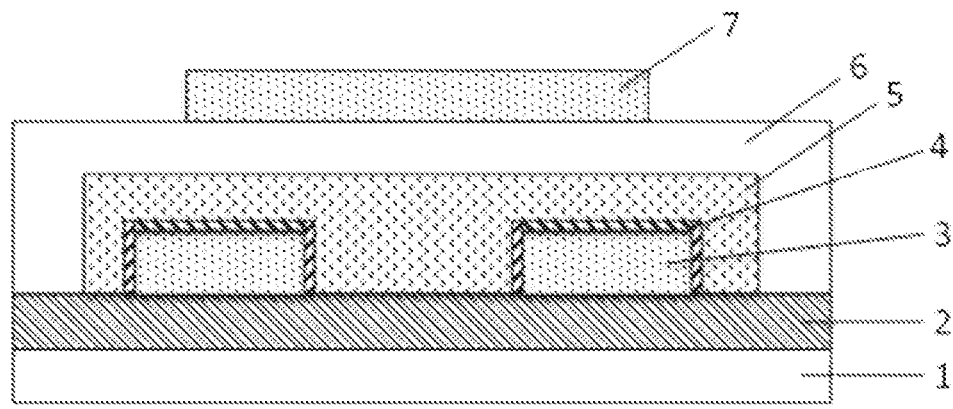
FIG. 1 illustrates a thin film transistor structure incorporating source and drain electrodes treated with a polymeric surface-modifying layer according to the present teachings. In particular, the thin film transistor as shown has a top-gate bottom-contact configuration, which includes a substrate 1, a buffer/planarization layer 2, source and drain electrodes 3, a polymeric surface-modifying layer 4, an organic semiconductor layer 5, a gate dielectric 6, and a gate electrode 7.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

It should be understood that the order of steps or order for performing certain actions is immaterial so long as the present teachings remain operable. Moreover, two or more steps or actions may be conducted simultaneously.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

As used herein, a "polymeric compound" (or "polymer") refers to a molecule including a plurality of one or more repeating units connected by covalent chemical bonds. A polymeric compound can be represented by the general formula:

$$*\text{-}(\!-\!M\!-\!)\text{-}*$$

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units $$*\text{-}(\!-\!M^a\!-\!)\text{-}* \text{ and } *\text{-}(\!-\!M^b\!-\!)\text{-}*,$$

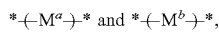

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

$$*\text{-}(\!-\!M^a_x\text{-}M^b_y\!-\!)\text{-}*$$

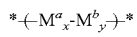

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

The present teachings relate to novel polymeric materials for electrode treatment that can yield the performance benefits offered by current self-assembled monolayer technology (typically, via small-molecule thiols) without the drawback of unstable device performance. Specifically, the present polymeric electrode modifiers can be used to achieve high charge carrier mobility and increased on-current in organic electronic devices, while conferring advantages such as improved thermal stability and long-term environmental stability over small-molecule thiol treatment.

Generally, the present polymeric electrode modifiers can be derived from an episulfide monomer of the formula:

where the moiety

is a carbocyclic group having 5-20 carbon atoms. As examples, the episulfide monomer can be selected from the group consisting of cyclohexene episulfide (C6), cyclopentene episulfide (C5), cycloheptene episulfide (C7), and cyclooctene episulfide (C8):

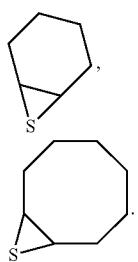

In some embodiments, the episulfide monomer can include larger (e.g., having 10-20 carbon atoms) polycyclic (e.g., bicyclic or tricyclic) group, an example of which is dicyclopentene episulfide. In various embodiments, the episulfide monomer can be cyclohexene sulfide (CHES):

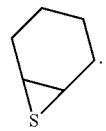

Upon an acid-catalyzed ring-opening polymerization reaction, the episulfide monomer can polymerize into a polymer having a repeating unit of the formula:

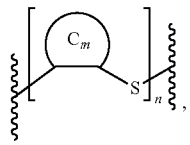

where the moiety $C_m$ is as defined hereinabove, and n, which defines the degree of polymerization of the polymer, can be an integer ranging from 3 to 1,000 (inclusive). In various embodiments, the present polymer can have a degree of polymerization (n) ranging from 10 to 50 (inclusive).

To illustrate, the polymer can have a repeating unit selected from the group consisting of:

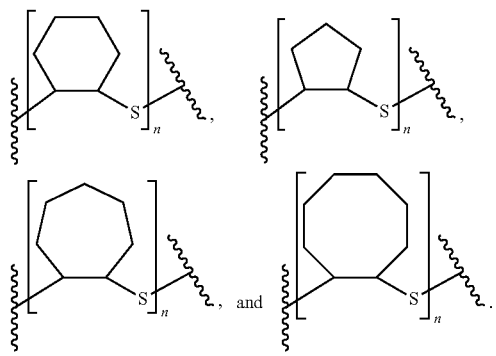

In various embodiments, the polymerization reaction can be self-limiting, and the end groups of the present polymer can be a thiol group. In other embodiments, the polymerization reaction can be terminated by adding a quencher or an inhibitor. For example, a specific embodiment of the present polymer can be poly-CHES (PCHES):

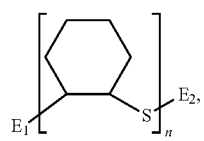

where $E_1$ and $E_2$ are identical or different end groups selected from the group consisting of H, $R^1$, $NH_2$, $NHR^1$, $N(R^1)_2$, SH, $SR^1$, and $OR^1$, where $R^1$, at each occurrence, independently can be selected from the group consisting of a $C_{1-10}$ alkyl group, a $C_{1-10}$ alkenyl group, and a phenyl group. More generally, the present polymer can be of the formula:

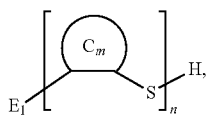

where $E_1$; $C_m$, and n are as defined hereinabove.

The present polymeric electrode modifier can be soluble in various common organic solvents. As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone. The present polymers can have room temperature solubilities in aromatic solvents such as anisole as high as 10 g/L.

The polymeric electrode modifiers described herein can be dissolved, dispersed or suspended in a single solvent or mixture of solvents to provide a composition suitable for solution processing techniques. In various embodiments, the composition can include the polymeric electrode modifiers as the only active component. In some embodiments, the composition also can include an episulfide compound such as any of the episulfide monomers described hereinabove. Common solution-phase processing techniques include, for example, spin coating, slot coating, doctor blading, dropcasting, zone casting, dip coating, blade coating, or spraying. Another example of solution-phase processing technique is printing. As used herein. "printing" includes a noncontact process such as inkjet printing, microdispensing and the like, and a contact process such as screen-printing, gravure printing, offset printing, flexographic printing, lithographic printing, pad printing, microcontact printing and the like.

In various embodiments, the present polymeric electrode modifiers can be dissolved in an organic solvent or solvent mixture to provide a composition which is used to contact one or more electrodes in an optical, electronic, or optoelectronic device, where the one or more electrodes are composed of a metal or metal alloy. For example, the one or more electrodes can be composed of silver, gold, platinum, copper, aluminum, molybdenum, palladium, nickel, or combinations thereof. In some embodiments, the electrode can be made of silver. In other embodiments, the electrode can be made of gold. In yet other embodiments, the electrodes can be made of molybdenum.

The composition including the present polymeric electrode modifier can be contacted with the electrodes by immersing the electrodes into the composition. In other embodiments, the composition can be deposited on the electrodes by other solution-phase processing techniques such as spin-coating and blade-coating. Subsequently, any excess amount of the composition can be removed by spin-drying and any unbound polymeric electrode modifiers can be rinsed off. The resulting surface-modifying layer can form conformity on the surfaces of the electrodes. Without wishing to be bound by any particular theory, it is believed that the sulfur atoms of the present polymeric electrode modifiers can adsorb to metal surfaces in a self-assembled manner similar to standard thiols and sulfides, which helps limit the thickness of the polymeric surface-modifying layer, thereby preventing the polymer film from becoming an electrically insulating layer.

A surface-modifying layer composed of the present polymeric electrode modifiers can confer advantages such as thermal stability and long-term environmental stability. In organic electronic devices such as thin film transistors, treating the electrodes with the present polymeric electrode modifiers can improve charge injection (e.g., by modifying the work function of the metal electrodes to match the orbital energy of the channel layer material), increase the device charge carrier mobility and/or increase the on-current.

FIG. 1 illustrates an organic thin film transistor incorporating a surface-modifying layer according to the present teachings. While the top gate-bottom contact architecture is illustrated, other configurations (e.g., bottom gate-bottom contact) also can be used. Specifically, the thin film transistor generally includes a substrate 1 (usually glass or plastic). An optional planarization layer 2 can be present on the substrate. In the bottom-contact architecture, the source and drain electrodes 3 are formed either directly on the substrate or on the planarization layer (if present). The source/drain electrodes can be formed using various deposition techniques. For example, the electrodes can be deposited through a mask, or can be deposited then etched or lifted off (photolithography). Suitable deposition techniques include electrodeposition, vaporization, sputtering, electroplating, coating, laser ablation and offset printing, from metal or metal alloy including copper, aluminum, gold, silver, molybdenum, platinum, palladium, and/or nickel. Once the source and drain electrodes have been formed, they can be treated with the present polymeric electrode modifiers as described above to provide a surface-modifying layer 4. Next, the organic semiconductor layer (i.e., the channel layer) 5 can be deposited via various solution-phase processing techniques. With respect to the composition of the channel layer, various p-type semiconductors and n-type semiconductors can be used. Examples of p-type semiconductors include to oligothiophenes, polythiophenes, and various pentacene compounds known in the art. Examples of n-type semiconductors include fluorocarbon-substituted thiophene oligomers and polymers, cyanated perylene diimides and cyanated naphthalene diimides, to name a few. To complete the device, a gate dielectric layer 6 is deposited on top of the organic semiconductor layer, and the gate electrode 7 can be formed on top of the gate dielectric layer using the same deposition techniques as the source and drain electrodes.

Figure 2:
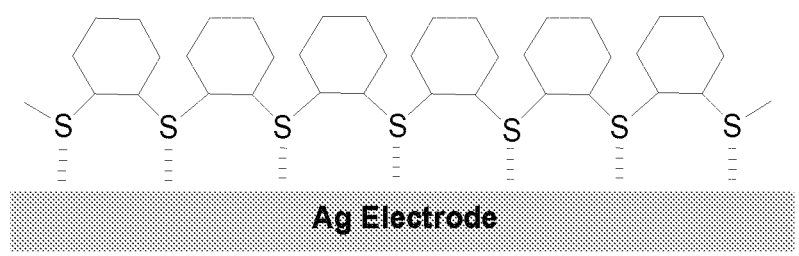
FIG. 2 is a schematic diagram illustrating how PCHES may arrange itself on the surface of a silver (Ag) electrode.

In alternative embodiments, instead of carrying two separate steps to form the surface-modifying layer and the channel layer, a composition including both the present polymeric electrode modifier and a suitable organic semiconducting compound can be used instead. Given the polymeric nature of the present surface modifiers, common organic solvents can be found in which both the surface modifier and the organic semiconductor have reasonable solubilities. In such embodiments, after the source and drain electrodes have been formed, the composition including both the present polymeric electrode modifier and a suitable organic semiconducting compound can be contacted with the source and drain electrodes. The sulfur atoms of the present polymeric electrode modifiers can adsorb to the surfaces of the metal (e.g., Ag) source and drain electrodes in a self-assembled manner as illustrated in FIG. 2. Upon annealing, the organic semiconducting compound in the composition can provide the channel layer adjacent to the surface-modifying layer. As shown later in the examples, devices prepared by this one-step process manifested similar electrical characteristics as conventional devices where the surface-modifying layer and the organic semiconductor layer were formed in two separate steps. As such, the present surface modifiers also provide the advantage of simplifying the device fabrication process.

The following examples are provided to illustrate further and to facilitate the understanding, of the present teachings and are not in any way intended to limit the invention.

Example 1: Synthesis of Poly-CHES (PCHES)

Scheme 1

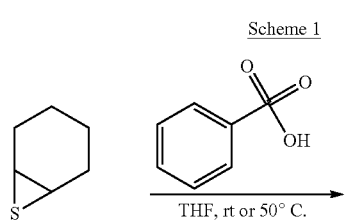

Example 1a

Preparation of PCHES-1: A solution of cyclohexene sulfide (CHES) (0.82 g, 6.92 mmol) in THF (5 mL) was well stirred at room temperature. Benzenesulfonic acid (54.3 mg, 0.34 mmol) was then added. The resulting solution was allowed to be stirred at rt for 17 h, before it was precipitated in methanol (200 mL). The precipitate was collected by filtration, washed with methanol, and dried in vacuum, leading to a white powder as the product (26.2 mg, 3.2%). GPC (THF, rt): Mn=1.7K, PDI=4.2.

Example 1b

Preparation of PCHES-2: A solution of CHES (1.01 g, 8.85 mmol) in THF (6 mL) was well stirred at rt. Benzenesulfonic acid (67.3 mg, 0.43 mmol) was then added. The resulting solution was then raised to 50° C. and allowed to be stirred at this temperature for 16 h, before it was cooled to rt and precipitated in methanol (200 mL). The precipitate was collected by filtration, washed with methanol, and dried in vacuum, leading to a white powder as the product (0.61 g, 60.4%). GPC (THF, rt): Mn=2.0K, PDI=1.3. 1H NMR, 400 MHz, CDCl$_3$: 2.91 (s, br, 2H), 2.19 (s, br, 2H), 1.68 (s, hr, 2H), 1.55 (s, hr, 2H), 1.38 (s, hr, 2H).

Figure 3:
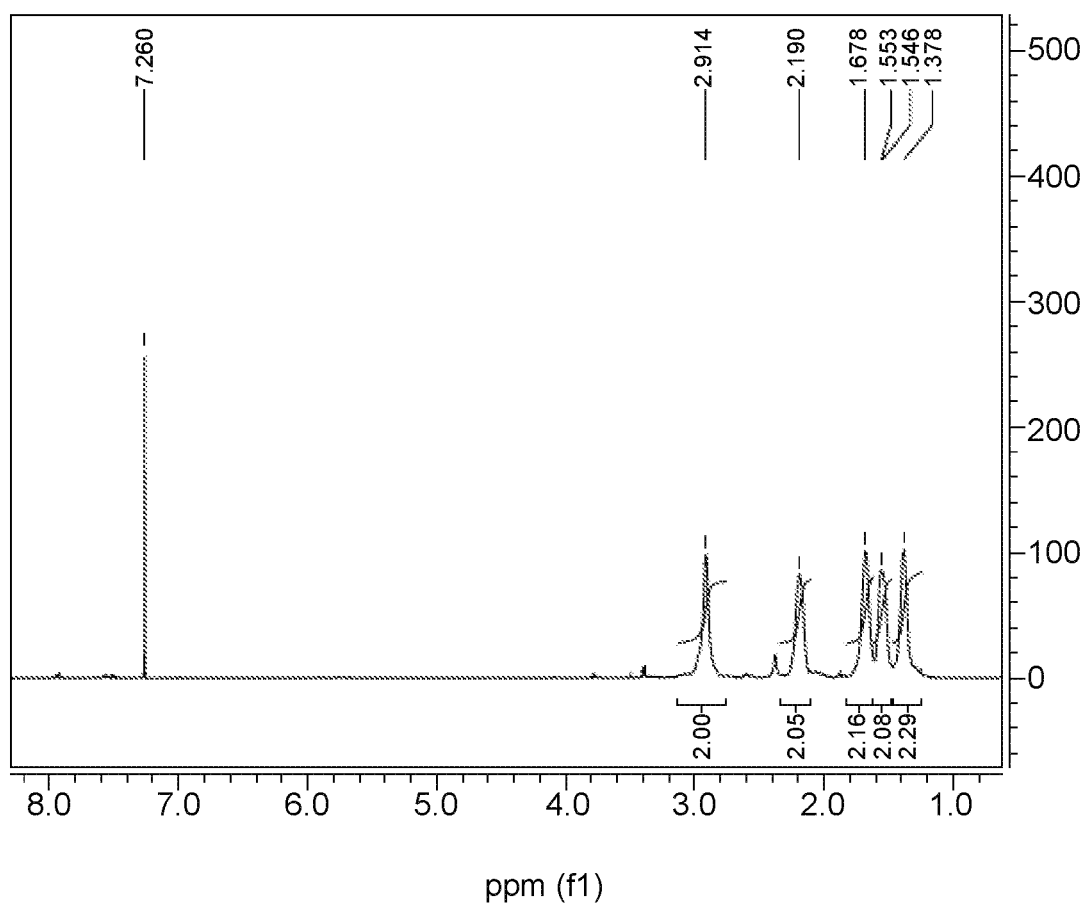
FIG. 3 shows the 1H NMR spectrum of PCHES.

FIG. 3 provides the NMR spectrum of PCHES-2.

Example 2: Synthesis of Additional Polymeric Electrode Modifiers

In lieu of cyclohexene sulfide, cyclic thiirane monomers having different ring sizes could be used to synthesize additional polymeric electrode modifiers according to the present teachings. For example, thiirane monomers such as cyclopentane sulfide, cycloheptene sulfide, and cyclooctene sulfide, could be synthesized from their corresponding epoxides by employing potassium thiocyanate or thiourea. See e.g., Chen et al., *Tetrahedron Lett.,* 58: 1651-1654 (2017); Eisavi et al., *J. Sulfur Chem.,* 37: 537-545 (2016); Eisavi et al., *Phosphorus, Sulfur, Silicon Relat. Elem.,* 191: 65-69 (2016); Darensbourg et al., *Macromolecules,* 46: 8102-8110 (2013); Mirza-Aghayan et al., *J. Sulfur Chem.,* 36: 30-35 (2015); and Azizi et al., *Synlett.,* 5: 1085-1088 (2014). These other cyclic thiirane monomers could then provide the corresponding polymers using the polymerization reaction illustrated in Example 1, as shown in Scheme 2 below, Scheme 2

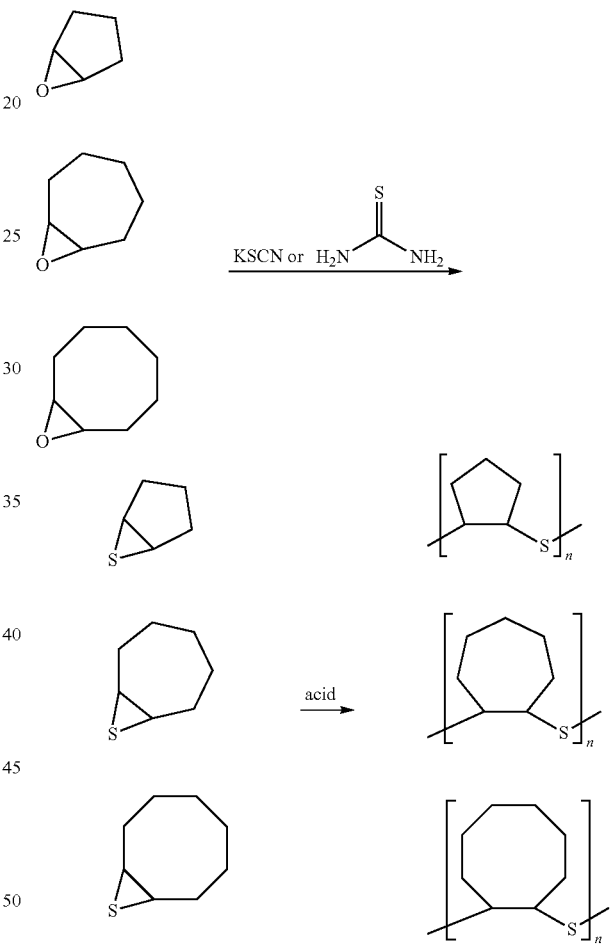

Scheme 3 below illustrates how bicyclic thiirane compounds, prepared similarly from bicyclic epoxides such as those described in Vereshchagina et al., *Petroleum Chem.,* 54: 207-212 (2014), could be polymerized analogously to achieve additional polymeric electrode modifiers according to the present teachings.

Scheme 3

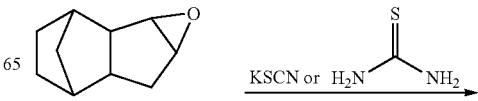

-continued

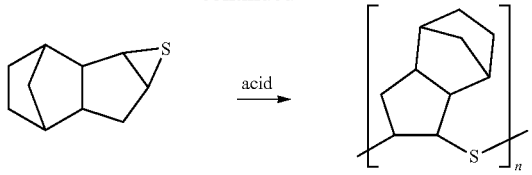

The present polymer also can be achieved from various cyclic thiirane monomers described herein via nucleophilic polymerization. See e.g., Lautenschlaeger et al., *J. Polym. Sci. Part A-1*, 8: 2579-2594 (1970), and Culvenor et al., *J. Chem. Soc.*, 282-287 (1949). Scheme 4 below illustrates the preparation of PCHES via nucleophilic polymerization from cyclohexene sulfide.

Scheme 4

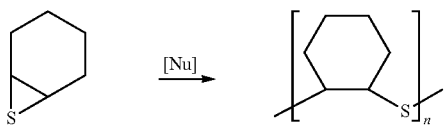

Example 3: Thin-Film Transistors with PCHES-Treated Electrodes

Thin-film transistors having source and drain electrodes modified according to the present teachings were fabricated. The top gate-bottom contact architecture illustrated in FIG. 1 was used; however, other configurations (e.g., bottom gate-bottom contact) can be used as well Specifically, starting with a suitable substrate 1 (glass or plastic), a photocurable planarization layer 2 was spin-coated, then UV-cured and baked. The source and drain contacts (silver) 3 were then formed via thermal evaporation through a shadow mask. The contacts were treated by immersion in an anisole solution of PCHES (1 mg/ml PCHES-1 in anisole, see Example 1a) for 30 seconds, followed by spin-drying and rinsing with fresh anisole to remove unbound PCHES. The resulting layer is illustrated as a work-function modifier layer (or surface-modifying layer) 4 in FIG. 1. The devices were completed by spin-coating the semiconductor layer 5 (in this case, composed of an N-type organic semiconductor) and the gate insulator layer 6, followed by thermal evaporation of a Ag gate electrode 7. The channel dimensions were 60 (L) by 1000 μm (W). The capacitance of the gate insulator layer was 3.0 nF/cm².

All transistors were tested in the dark in ambient environment using a home-built coaxial probe station employing a Keithley 6430 subfemtoammeter and a Keithley 2400 source meter, operated by a local Labview program and GPIB communication. Triaxial and/or coaxial shielding was incorporated into a Signaton probe station to minimize noise.

Mobilities (μ) were calculated by standard field effect transistor equations. Specifically, in traditional metal-insulator-semiconductor FETs (MISFETs), there is typically a linear and saturated regime in the $I_{DS}$ vs $V_{DS}$ curves at different $V_G$ (where $I_{DS}$ is the source-drain saturation current; $V_{DS}$ is the potential between the source and drain, and $V_G$ is the gate voltage). At large $V_{DS}$, the current saturates and is given by:

$$(I_{DS})_{sat} = (WC_i/2L)\mu(V_G-V_t)^2 \quad (1)$$

where L and W are the device channel length and width, respectively, $C_i$ is the capacitance of the oxide insulator ($1\times10-8$ F/cm² for 300 nm $SiO_2$), and $V_t$ is the threshold voltage. Mobilities (μ) in the saturation regime therefore can be determined by rearranging equation 1 into:

$$\mu_{sat} = (2I_{DS}L)/[WC_i(V_G-V_t)^2]$$

where $C_i$, in this case, was $3\cdot10^{-9}$ F/cm². The threshold voltage ($V_t$) can be estimated as the x intercept of the linear section of the plot of $V_G$ versus $(I_{DS})^{1/2}$ (at $V_{SD}=-100$ V).

Figure 4:
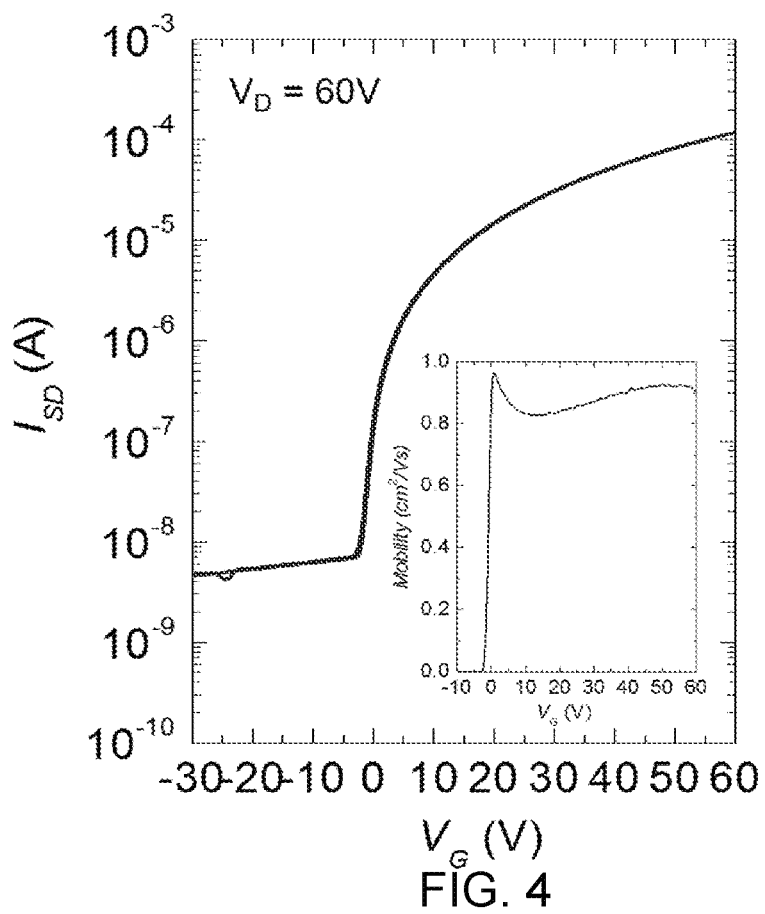
FIG. 4 illustrates the transfer characteristics and mobility evolution (inset) of thin-film transistors including source and drain electrodes treated according to the present teachings (specifically, with PCHES).

FIG. 4 shows the device performance of a representative PCHES-treated transistor. The mean charge carrier mobility was around 0.8 cm²/Vs as shown in the inset.

Figure 5:
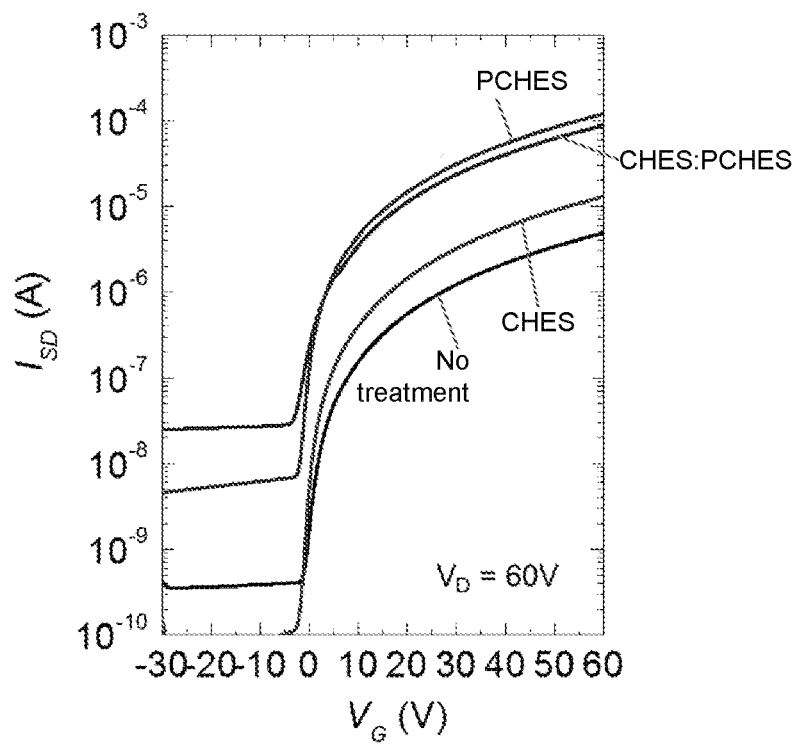
FIG. 5 illustrates the transfer characteristics of TFTs employing different contact treatments. Specifically, the transfer plots of two different thin film transistors including source and drain electrodes treated according to the present teachings (respectively, with PCHES, and a 1:1 CHES:PCHES mixture formulation) are compared against those of two comparative thin film transistors including source and drain electrodes either with no treatment or treated with the monomer CHES only.

Additional transistors were fabricated in a manner similar to the above procedures, except that a 1:1 solution of PCHES:CHES was used as the contact treatment instead of PCHES-1. FIG. 5 shows the device performance of a representative PCHES:CHES-treated transistor. The mean charge carrier mobility was around 0.6 cm²/Vs.

Comparative Example 3: Comparative Thin-Film Transistors

Comparative transistors were fabricated in a manner similar to Example 3, except that the source and drain electrodes were treated with different conditions: a) no work-function modifier, and h) the monomer cyclohexene sulfide (CHES) was used in lieu of PCHES. Representative electrical performance of the two comparative devices is shown in FIG. 5 (versus the electrical performance of the two devices of Example 3). The mean charge carrier mobilities were 0.04 cm²/Vs for the no-work function modifier devices, and 0.09 cm²/Vs for the monomer CHES-treated devices, respectively.

Referring to FIG. 5, it can be seen that treatment with PCHES (by itself or in combination with CHES) promoted electron injection in the N-type organic TFT devices. Specifically, the data showed that treatment with PCHES improved the device charge carrier mobility significantly (by 6-20 times) compared to the devices with no contact treatment or with electrodes treated by the monomer CHES.

Example 4: Concentration Studies

Additional thin-film transistors were fabricated in a manner similar to Example 3, except that the following concentrations of PCHES-1 were tested: 0.5 mg/ml, 1.0 mg/ml, and 5 mg/ml.

Comparative transistors were fabricated with a standard small molecule thiol (2-methxythiophenol, MOTP) known to be a good work-function modifier for N-type organic TFTs. See Boudinet et al., Organic Electronics, 11: 227-237 (2010).

Figure 6:
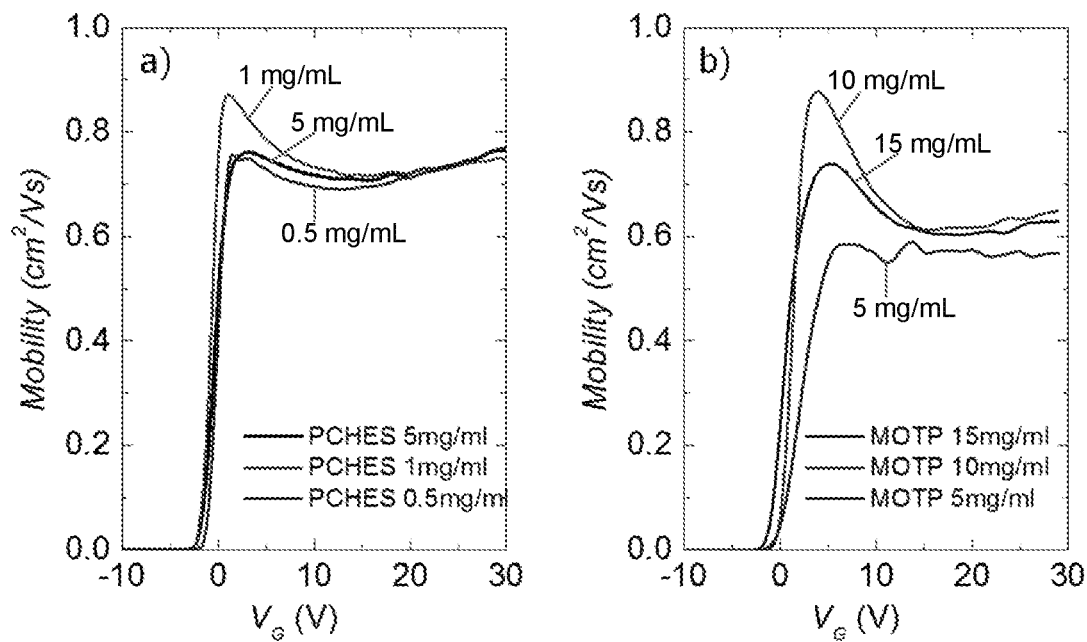
FIG. 6 compares the mobility evolution of TFTs employing different concentrations of a) PCHES treatment and b) MOTP treatment.

FIG. 6 shows the mobility evolution of TFTs employing different concentrations of a) PCHES and b) MOTP treatment. It can be seen that to achieve a mobility of around 0.8 cm²/Vs, only a concentration of 1 mg/ml or less is needed when PCHES treatment was employed. By comparison, to achieve a mobility of around 0.8 cm²/Vs, a much higher concentration, i.e, at least 10 mg/ml, of MOTP was needed, which is 10 times higher than the PCHES treatment.

Example 5: Thermal Stability Studies

This example illustrates the thermal stability of PCHES-treated transistors. Specifically, PCHES-treated transistors were fabricated according to the procedures described in Example 1, except that they were also annealed at 130° C. in air on a hot plate after the device was completed. Electrical characteristics were measured under room temperature before annealing (0 min), after a 5-minute annealing cycle (5 min), after a second 10-minute annealing cycle (total annealing time: 15 min), and after a third 30-minute annealing cycle (total annealing time: 45 min).

Comparative transistors were fabricated with MOTP electrode treatment according to the procedures described in Example 4. The completed devices were annealed at 130° C. in air on a hot plate for different durations. Similar to the PCHES-treated devices, electrical characteristics of the comparative devices were measured under room temperature before annealing (0 min), after a 5-minute annealing cycle (5 min), after a second 10-minute annealing cycle (total annealing time: 15 min), and after a third 30-minute annealing cycle (total annealing time: 45 min).

Figure 7:
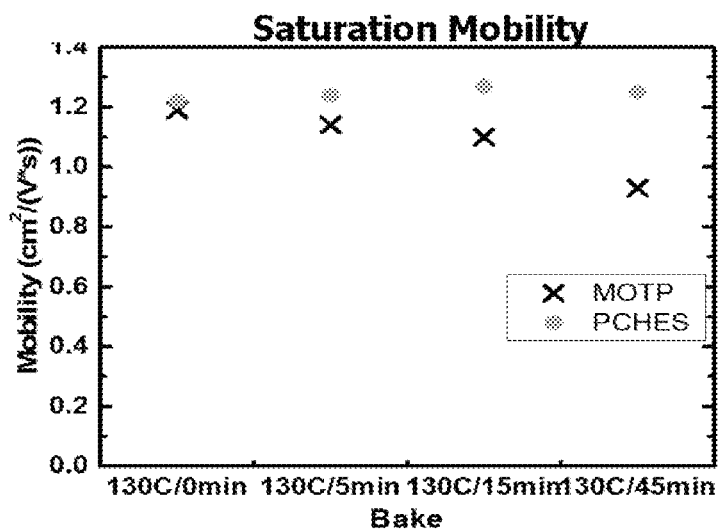
FIG. 7 shows the effect of annealing (before and after annealing at 130° C. for 5 minutes, 15 minutes, and 45 minutes) on the saturation mobility of thin film transistors. Thin film transistors including source and drain electrodes treated according to the present teachings (specifically, with PCHES) were compared to thin film transistors including source and drain electrodes treated with a standard thiol work-function modifier (specifically, MOTP).

As shown in FIG. 7, the PCHES-treated transistors showed negligible variations in mobility after continuous annealing, suggesting that the source and drain treatment according to the present teachings helps maintain device stability against heat treatment.

By comparison, the thiol-treated transistors experienced a pronounced degradation in mobility upon continuous annealing (from ~1.2 $cm^2/Vs$ before annealing to ~0.9 $cm^2/Vs$ after 45 minutes of annealing at 130° C.).

Example 6: Long Term Stability

This example illustrates the long-term stability of PCHES-treated transistors. Specifically, PCHES-treated transistors were fabricated according to the procedures described in Example 1. The completed devices were stored in an environmental chamber under 70° C. and 23% relative humidity. Electrical characterization was performed in-situ to investigate the TFT stability over the course of 10 days.

Comparative transistors were fabricated with MOTP electrode treatment according to the procedures described in Example 4. Similar to the PCHES-treated devices, the completed devices were stored in an environmental chamber under 70° C. and 23% relative humidity, and electrical characterization was performed in-situ to investigate the TFT stability over the course of 10 days.

Figure 8:
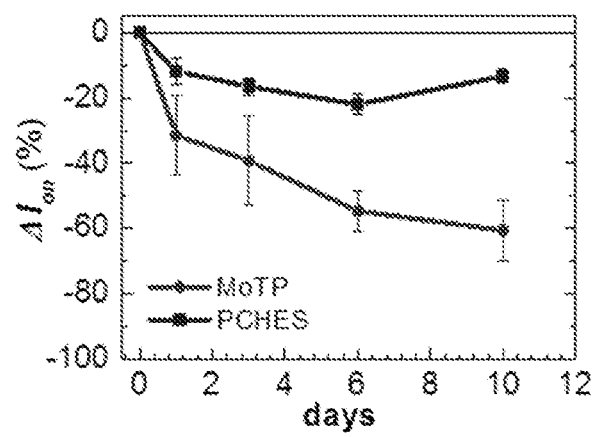
FIG. 8 shows the long term stability of thin film transistors including source and drain electrodes treated according to the present teachings (specifically, with PCHES) compared to thin film transistors including source and drain electrodes treated with a standard thiol (specifically, MoTP), where long term stability was demonstrated via the lack of on-current degradation.

FIG. 8 shows the observed changes in on-current over time. As shown in FIG. 8, the PCHES-treated transistors showed less than 20% degradation in the on-current after being in storage for 10 consecutive days.

By comparison, the thiol-treated transistors experienced a 60% degradation in the on-current after being in storage for 10 consecutive days.

Example 7: One-Step Process Evaluation

In this Example, we investigated combining the electrode surface treatment and the deposition of the organic semiconductor in one single step. Specifically, transistors were fabricated using procedures similar to those described in Example 1, except that PCHES was added into the organic semiconductor formulation, so that the surface-modifying layer 4 and the semiconductor layer 5 were deposited in one step. Specifically, PCHES was added in the OSC formulation at a concentration of 1~10 mg/ml and the mixture formulation was spun immediately after casting.

Figure 9:
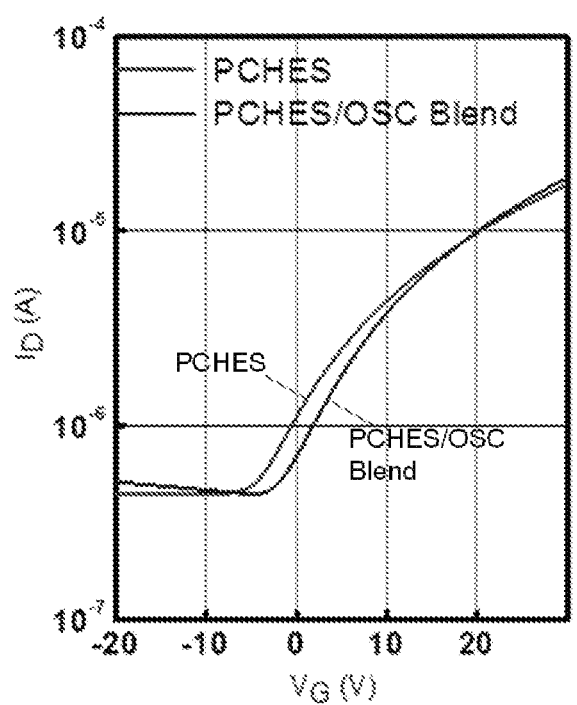
FIG. 9 compares the transfer characteristics of TFTs having contacts treated with PCHES (as a separate step from the deposition of the organic semiconductor layer) versus TFTs having contacts treated via a one-step process using a formulation including both PCHES and the organic semiconductor.

FIG. 9 illustrates the electrical characteristics of the one-step TFT vis-à-vis the PCHES-treated TFT fabricated according to the procedures described in Example 1. As shown in FIG. 9, the electrical characteristics of the two types of devices are comparable, demonstrating that the surface treatment according to the present teachings further provides an advantage of simplifying the device fabrication process.

Example 8: Work Function Modification

To understand the effect of work function modification, sample devices were prepared. First, a photocurable planarization layer 2 was spin-coated onto a suitable substrate 1, then UV-cured and baked. Next, a metal layer composed of either silver or gold 3 was thrilled via thermal evaporation without a mask. The metal layer was treated by immersion in an anisole solution of PCHES (1 mg/ml PCHES-1 in anisole) for 30 seconds, followed by spin-drying and rinsing with fresh anisole to remove unbound PCHES. The work function of the metal layer surfaces was measured by Ultraviolet Photoelectron Spectroscopy (UPS) and compared with untreated metal surfaces.

It was found that the work function of Ag surface was reduced from 4.5 eV to 4.2 eV after PCHES treatment. The work function of Au surface was reduced from 4.7 eV to 4.5 eV after PCHES treatment. These data demonstrate that the effect of work function modification of PCHES is comparable to a good work-function modifier for N-type organic TFTs. See Boudinet et al., *Organic Electronics*. 11: 227-237 (2010).

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An optical, electronic, or optoelectronic device comprising one or more electrodes comprising a metal or metal alloy, the surface of at least one of said electrodes being in contact with a surface-modifying layer, said surface-modifying layer comprising a polymer comprising a repeating unit of the formula:

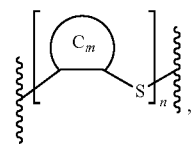

wherein the moiety

is a carbocyclic group having 5-20 carbon atoms, and n is an integer ranging from 3 to 1,000 (inclusive).

2. The device of claim 1, wherein the polymer comprises a repeating unit selected from the group consisting of:

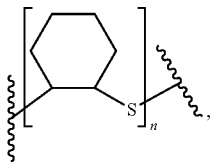 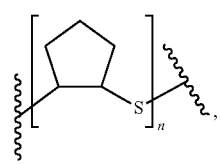

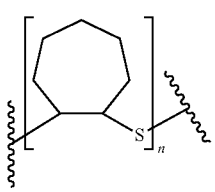 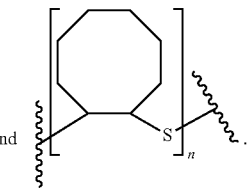

3. The device of claim 2, wherein the polymer is of the formula:

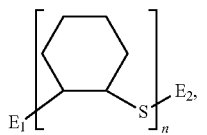

wherein $E_1$ and $E_2$ are identical or different end groups selected from the group consisting of H, $R^1$, $NH_2$, $NHR^1$, $N(R^1)_2$, SH, $SR^1$, and $OR^1$, wherein $R^1$, at each occurrence, independently is selected from the group consisting of a $C_{1-10}$ alkyl group, a $C_{1-10}$ alkenyl group, and a phenyl group.

4. The device of claim 1, wherein said surface-modifying layer further comprises an episulfide compound.

5. The device of claim 1, wherein said at least one electrode comprises a metal or metal alloy selected from the group consisting of silver, gold, platinum, copper, aluminum, molybdenum, palladium, nickel, and combinations thereof.

6. The device of claim 1 configured as a thin film transistor, said thin film transistor comprising a substrate, an organic semiconductor layer, source and drain electrodes in contact with the organic semiconductor layer, a gate dielectric layer, and a gate electrode in contact with the gate dielectric layer, wherein the surfaces of the source and drain electrodes are in contact with the surface-modifying layer.

7. The device of claim 6, wherein the organic semiconductor layer comprises an n-type organic semiconductor.

8. The device of claim 6, wherein the thin film transistor has a top gate-bottom contact architecture.

9. A method for modifying one or more electrodes in an optical, electronic, or optoelectronic device, wherein said one or more electrodes comprise a metal or metal alloy, the method comprising:

contacting the one or more electrodes with a composition comprising a polymer comprising a repeating unit of the formula:

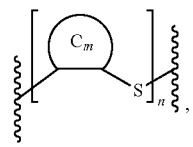

wherein the moiety

is a carbocyclic group having 5-20 carbon atoms, and n is an integer ranging from 3 to 1,000 (inclusive), to form a surface-modifying layer in contact with the surfaces of the one or more electrodes.

10. The method of claim 9, wherein the polymer comprises a repeating unit selected from the group consisting of:

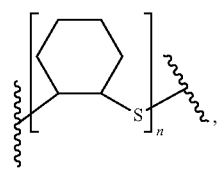 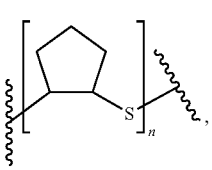

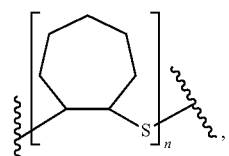 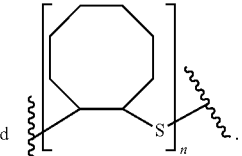

11. The method of claim 10, wherein the polymer is of the formula:

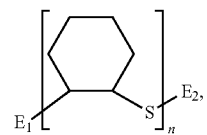

wherein $E_1$ and $E_2$ are identical or different end groups selected from the group consisting of H, $R^1$, $NH_2$, $NHR^1$, $N(R^1)_2$, SH, $SR^1$, and $OR^1$, wherein $R^1$, at each occurrence, independently is selected from the group consisting of a $C_{1-10}$ alkyl group, a $C_{1-10}$ alkenyl group, and a phenyl group.

12. The method of claim 9, wherein the composition further comprises an episulfide compound.

13. The method of claim 9, wherein said one or more electrodes comprise a metal or metal alloy selected from the group consisting of silver, gold, platinum, copper, aluminum, molybdenum, palladium, nickel, and combinations thereof.

14. The method of claim 9, wherein the device is a thin film transistor, said thin film transistor comprising a substrate, an organic semiconductor layer, source and drain electrodes in contact with the organic semiconductor layer, a gate dielectric layer, and a gate electrode in contact with the gate dielectric layer, and wherein the surfaces of the source and drain electrodes are in contact with the surface-modifying layer.

15. The method of claim 14 comprising forming the organic semiconductor layer prior to contacting the source and drain electrodes with the composition.

16. The method of claim 14, wherein the composition further comprises an organic semiconducting compound.

17. The method of claim 16, further comprising annealing the composition to form the organic semiconductor layer above the surface-modifying layer.

18. The method of claim 9, wherein contacting is performed by immersion, spin-coating, or blade-coating.

* * * * *